(12) United States Patent
Tuan

(10) Patent No.: US 7,746,644 B2
(45) Date of Patent: Jun. 29, 2010

(54) PACKAGE ASSEMBLY WITH HEAT DISSIPATING STRUCTURE

(75) Inventor: Wei-Hsing Tuan, Taipei (TW)

(73) Assignee: National Taiwan University, Taipei (TW)

( * ) Notice: Subject to any disclaimer, the term of this patent is extended or adjusted under 35 U.S.C. 154(b) by 38 days.

(21) Appl. No.: 12/027,643

(22) Filed: Feb. 7, 2008

(65) Prior Publication Data
US 2008/0291633 A1 Nov. 27, 2008

(30) Foreign Application Priority Data
May 21, 2007 (TW) .............................. 96208232 U

(51) Int. Cl.
*H05K 7/20* (2006.01)
*F21V 29/00* (2006.01)
(52) U.S. Cl. ...................... 361/704; 361/707; 361/719; 257/706; 257/707; 362/373
(58) Field of Classification Search .................. 361/704, 361/707, 719; 257/706, 707; 165/80.3
See application file for complete search history.

(56) References Cited

U.S. PATENT DOCUMENTS

| | | | | |
|---|---|---|---|---|
| 5,698,896 A | * | 12/1997 | Komatsu et al. | 257/705 |
| 6,134,776 A | * | 10/2000 | Hoffmeyer | 29/840 |
| 6,428,189 B1 | * | 8/2002 | Hochstein | 362/373 |
| 6,670,751 B2 | * | 12/2003 | Song et al. | 313/512 |
| 6,690,087 B2 | * | 2/2004 | Kobayashi et al. | 257/686 |
| 6,860,621 B2 | * | 3/2005 | Bachl et al. | 362/373 |
| 6,874,910 B2 | * | 4/2005 | Sugimoto et al. | 362/294 |
| 6,949,772 B2 | * | 9/2005 | Shimizu et al. | 257/99 |
| 7,217,998 B2 | * | 5/2007 | Tamagawa et al. | 257/707 |
| 7,258,808 B2 | * | 8/2007 | Kwon et al. | 216/13 |
| 7,259,457 B2 | * | 8/2007 | Zhang et al. | 257/713 |
| 7,345,322 B2 | * | 3/2008 | Kikuchi | 257/99 |
| 7,550,319 B2 | * | 6/2009 | Wang et al. | 438/125 |
| 2006/0018120 A1 | * | 1/2006 | Linehan et al. | 362/247 |

* cited by examiner

*Primary Examiner*—Boris L Chervinsky
(74) *Attorney, Agent, or Firm*—Muncy, Geissler, Olds & Lowe, PLLC

(57) ABSTRACT

A package assembly with a heat dissipating structure includes a thermal conductive lower metal layer, an electric insulating ceramic layer, a patterned upper metal layer and an electronic component. The electric insulating ceramic layer is disposed on and bonded to the thermal conductive lower metal layer. The patterned upper metal layer is disposed on and bonded to the electric insulating ceramic layer. The patterned upper metal layer is a single-layered metal layer and has an opening from which the electric insulating ceramic layer is exposed. The electronic component is disposed in the opening of the patterned upper metal layer, mounted on the electric insulating ceramic layer through a thermally conductive adhesive or solder, and electrically connected to the patterned upper metal layer.

13 Claims, 4 Drawing Sheets

PACKAGE ASSEMBLY WITH HEAT DISSIPATING STRUCTURE

BACKGROUND OF THE INVENTION

1. Field of Invention

The invention relates to a package assembly, and more particularly to a thin package assembly of an electronic component capable of quickly dissipating the heat generated by the electronic component.

2. Related Art

Heat is generated when an electronic component is operating with electrons flowing therethrough. The generation of heat increases the resistance and blocks the flows of the electrons so that the function of the electronic component is significantly influenced. When the technology of manufacturing the electronic component is greatly enhanced, a line width in the electronic component is getting smaller and smaller, and the line density in the electronic component is getting higher and higher. Thus, the heat generated by the electronic component is increased rapidly. Taking a central processing unit (CPU) of a computer as an example, the Pentium CPU only has to be equipped with the package with the heat dissipating capability of 16 W at its early stage. However, the heat generated in the CPU in the year of 2004 has reached 84 W, and the heat generated in the CPU in the year of 2006 has reached 98 W. If the heat cannot be removed rapidly, the temperature of the CPU of the computer is rapidly increased so that the CPU of the computer can no longer operate. Thus, the heat dissipating ability of the substrate contacting with the CPU of the computer is a key factor for dominating whether the computer can operate normally or not.

A typical power component, such as a solid relay, is similar to the CPU of the computer and generates a lot of heat. Thus, the power component also dissipates the heat rapidly through the substrate contacting therewith so that it can operate normally.

Taking a light-emitting diode (LED) as another example, various color LEDs have been gradually developed, wherein the successful development of the white-light LED has attracted considerable attention. This is because the white-light LED can serve as a light source for an illumination lamp. The power consumption of a road lamp with the LED light source is lower than that of a mercury lamp by 75% and is lower than that of a high pressure sodium lamp by 49%. So, the white-light LED advantageously has the low power consumption and can significantly save the energy. However, the white-light LED with the output power higher than 3 W has to be adopted in the application of the lamp used in the daily life and the applications such as the head light used in a vehicle. This white-light LED with the high output power also generates a lot of heat. However, the major barrier on the applications of the LED as the light source is that the LED cannot withstand the high temperature. Generally speaking, the temperature of the LED cannot exceed 90° C. If the temperature of the LED is higher than 90° C., the luminance thereof rapidly deteriorates. So, the rapid heat dissipating ability of the heat dissipation substrate in contact with the LED has become a greatest challenge for determining whether the LED can become the illumination light source or not. This also specifies that the development of the heat dissipating substrate has played an important role on the applications of the LED as the light source.

In order to satisfy the miniaturized requirement of the current 3C electronic products, the substrate contacting with the CPU of the computer, or the power component or the LED has to satisfy the following fundamental requirements.

First, the material must have a high heat conductivity to dissipate the heat rapidly.

Second, the material must have the high resistivity in order to prevent the high power electronic component from being short-circuited.

Third, the substrate preferably has to be as thin as possible after the above-mentioned conditions are satisfied.

At present, the heat dissipating mechanisms of the electronic components, which are frequently used, include heat dissipating fins and a heat pipe accompanied with fans in order to dissipate the heat generated by the high power electronic components. However, such heat dissipating structure has a larger thickness, and the applications in designing a miniaturized 3C electronic product are thus hindered.

SUMMARY OF THE INVENTION

It is therefore an object of the invention to provide a thin package assembly of an electronic component capable of quickly dissipating the heat generated by the electronic component.

The invention achieves the above-identified object by providing a package assembly with a heat dissipating structure. The package assembly includes a thermal conductive lower metal layer, an electric insulating ceramic layer, a patterned upper metal layer and an electronic component. The electric insulating ceramic layer is disposed on and bonded to the thermal conductive lower metal layer. The patterned upper metal layer is disposed on and bonded to the electric insulating ceramic layer. The patterned upper metal layer is a single-layered metal layer and has an opening from which the electric insulating ceramic layer is exposed. The electronic component is disposed in the opening of the patterned upper metal layer, mounted on the electric insulating ceramic layer through a thermally conductive adhesive, and electrically connected to the patterned upper metal layer.

Therefore, the package assembly is thin and can quickly dissipate the heat generated by the electronic component.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention.

DETAILED DESCRIPTION OF THE INVENTION

The present invention will be apparent from the following detailed description, which proceeds with reference to the accompanying drawings, wherein the same references relate to the same elements.

Figure 1:
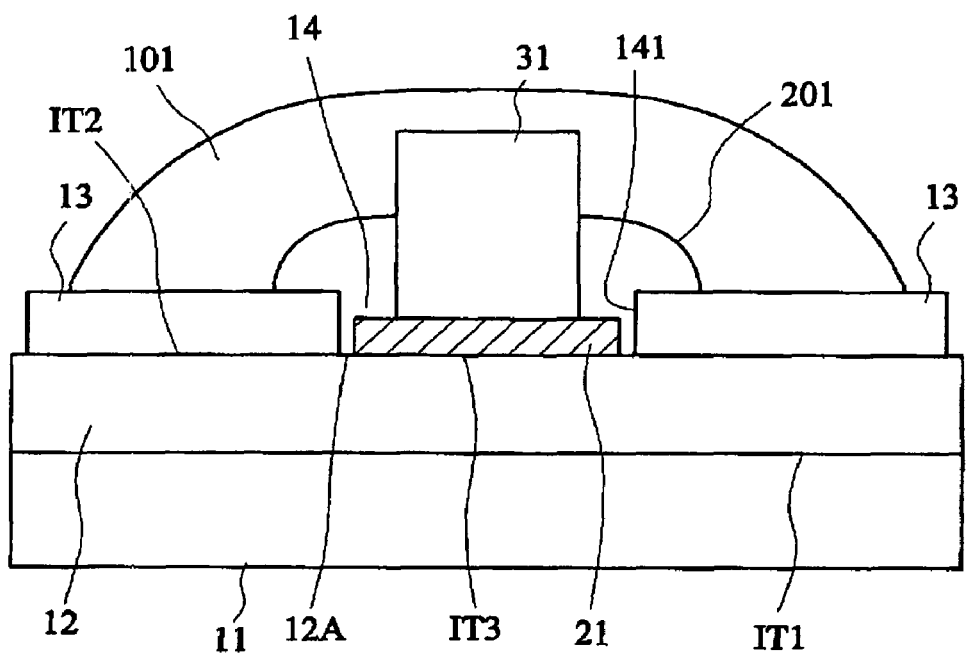
FIG. 1 is a side view showing a package assembly according to a first embodiment of the invention.
Figure 2:
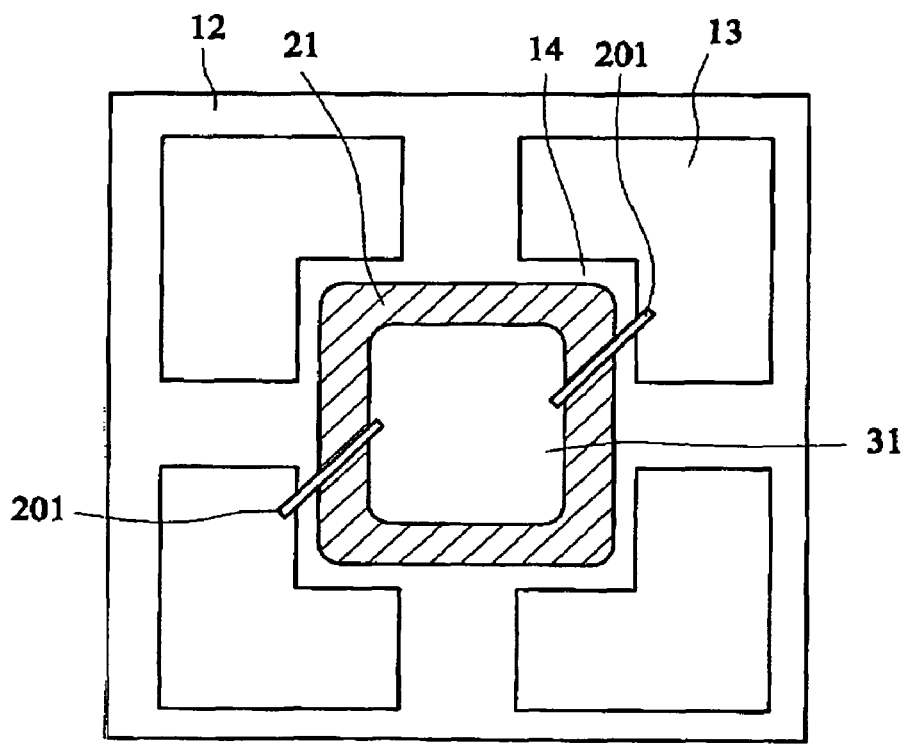
FIG. 2 is a top view showing the package assembly of FIG. 1.

The invention provides an improved thin package assembly with a heat dissipating structure. FIG. 1 is a side view showing a package assembly according to a first embodiment of the invention. FIG. 2 is a top view showing the package assembly of FIG. 1. Referring to FIGS. 1 and 2, the package assembly of this embodiment includes a thermal conductive lower metal layer 11, an electric insulating ceramic layer 12, a patterned upper metal layer 13 and an electronic component 31.

The electric insulating ceramic layer 12 is disposed on and bonded to the thermal conductive lower metal layer 11. The patterned upper metal layer 13 is disposed on and bonded to the electric insulating ceramic layer 12. The patterned upper metal layer 13 is a single-layered metal layer and has an opening 14 from which the electric insulating ceramic layer 12 is exposed. The electronic component 31 is disposed in the opening 14 of the patterned upper metal layer 13 and mounted on the electric insulating ceramic layer 12 through a thermally conductive adhesive or solder 21. The thermally conductive adhesive 21 and the patterned upper metal layer 13 are disposed on a too surface 12A of the electric insulating ceramic layer 12. In this embodiment, a sidewall of the opening 14 has a vertical surface 141. The thermal conductive lower metal layer 11, the electric insulating ceramic layer 12 and the patterned upper metal layer 13 constitute the heat dissipating structure.

The thermal conductive lower metal layer 11 may be made of copper and has a thickness ranging from 0.1 to 5 mm, for example. The electric insulating ceramic layer 12 is made of aluminum oxide or aluminum nitride and has a thickness ranging from 0.1 to 5 mm, for example. The patterned upper metal layer 13 is entirely made of the copper and has an electric connection point or a plurality of electric connection points. The patterned upper metal layer 13 has a thickness also ranging from 0.05 to 5 mm and has thermal conductive and electroconductive properties.

The electronic component 31 may be a central processing unit (CPU), a light-emitting diode (LED) or a power component, and is electrically connected to the patterned upper metal layer 13. There are many ways for electrically connecting the patterned upper metal layer 13 to the electronic component 31. In this example, the package assembly further includes a plurality of wires 201 electrically connected to the electronic component 31 and the patterned upper metal layer 13. The package assembly may further include a package material 101 applied to the patterned upper metal layer 13, the electronic component 31, the thermally conductive adhesive 21 and the wires 201 to encapsulate and protect the patterned upper metal layer 13, the electronic component 31, the thermally conductive adhesive 21 and the wires 201. Currents may flow through the wires 201 to power the electronic component 31.

The thickness of the heat dissipating structure may range from 0.3 to 15 mm. Many metal materials have the good thermal conductivity, wherein the silver material has the best thermal conductivity but the higher price. Among these materials, the copper material is the best choice under the consideration of the heat dissipating requirement and the cost-down requirement. As listed in Table 1, the coefficient of thermal conductivity of copper may reach 400 W/mK, and the thermal conductive lower metal layer 11 of the package assembly of the invention is made of the copper.

TABLE 1

| Material | Coefficient of thermal conductivity (W/mK) | Resistivity (Ω-cm) |
|---|---|---|
| Copper | 400 | $10^{-6}$ |
| Aluminum | 150 to 230 | $10^{-5}$ |
| Aluminum oxide | 20 to 38 | $>10^{14}$ |
| Aluminum nitride | 170 to 230 | $>10^{14}$ |
| Epoxy resin | 0.3 | $10^{14}$ |
| Thermally conductive adhesive | 1 to 6 | $<10^{14}$ |

Many materials, such as most polymeric organic materials or most ceramic materials, have the electric insulating property, as shown in Table 1. However, the ceramic material is the best choice under the consideration of the heat dissipating, the moisture isolating and the long-term reliability. The ceramic materials with the high thermal conductivity and the high insulating property include aluminum oxide having the coefficient of thermal conductivity ranging from 20 to 38 W/mK, and aluminum nitride having the coefficient of thermal conductivity ranging from 170 to 230 W/mK. The coefficient of thermal conductivity of the ceramic material has the wider range because the coefficient of thermal conductivity is greatly influenced by the purity and the co-firing additive of the ceramic material. However, the resistivity of each of the aluminum oxide and the aluminum nitride is higher than $10^{14}$ Ω-cm, so the two ceramic materials have the good electric insulating property. Also, the aluminum oxide and the aluminum nitride further have the advantages of the low dielectric constant and the high dielectric strength, so the electric insulating ceramic layer 12 is made of aluminum oxide or aluminum nitride in the package assembly of the invention.

As mentioned hereinabove, the copper has the excellent heat conductivity. In addition, the resistivity of the copper is extremely low. So, the heat dissipating structure of the invention is very thin, and the patterned upper metal layer 13 may also be made of the thermal conductive and electroconductive material, as shown in Table 1. The copper material is still the best choice for the patterned upper metal layer 13 under the consideration of the cost. The patterned upper metal layer 13 may be formed by etching and may serve as a portion of the circuit of the package assembly.

Figure 3:
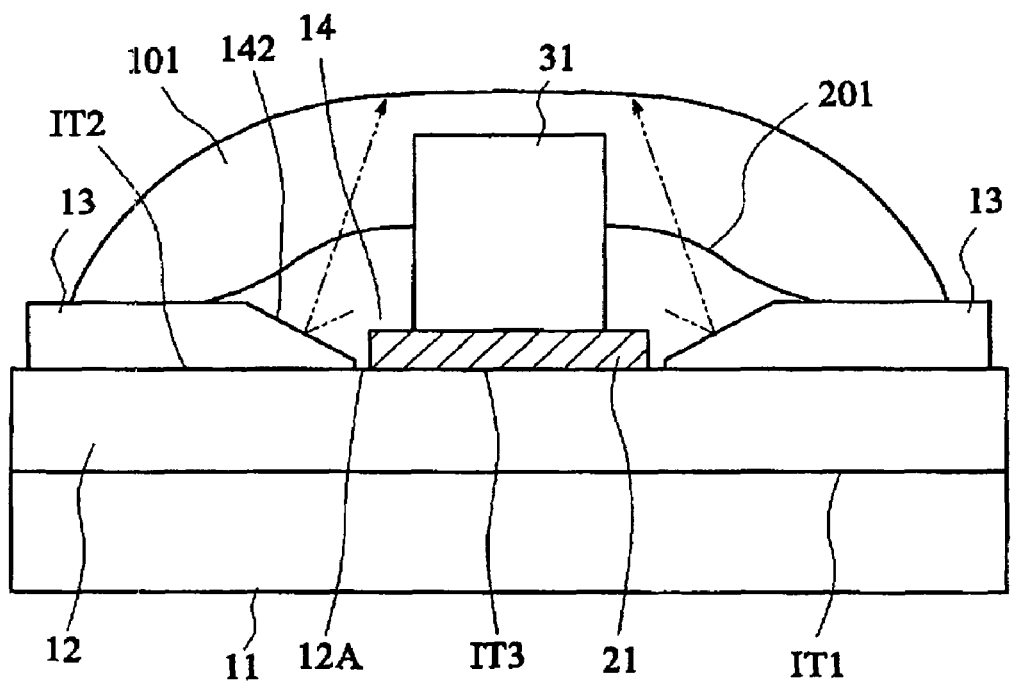
FIG. 3 is a side view showing a package assembly according to a second embodiment of the invention.
Figure 4:
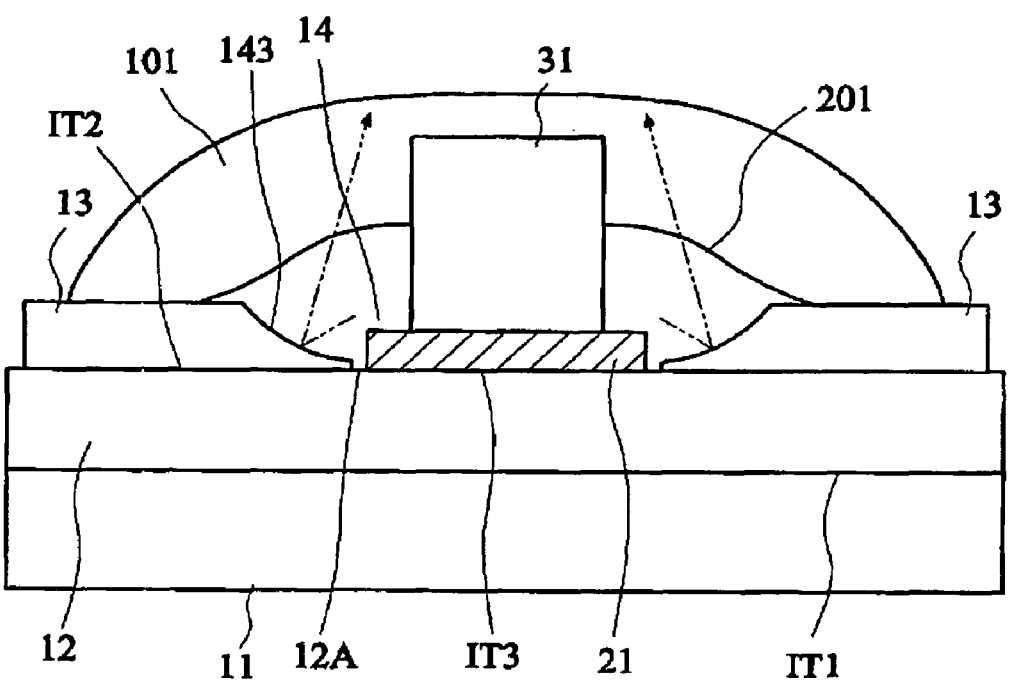
FIG. 4 is a side view showing a package assembly according to a third embodiment of the invention.

FIG. 3 is a side view showing a package assembly according to a second embodiment of the invention. As shown in FIG. 3, a sidewall of the opening 14 has an inclined surface 142 for reflecting light rays emitted from the electronic component (e.g., LED) 31. FIG. 4 is a side view showing a package assembly according to a third embodiment of the invention. As shown in FIG. 4, a sidewall of the opening 14 has a curved surface 143 for reflecting light rays emitted from the electronic component (e.g., LED) 31.

The aluminum oxide, the aluminum nitride or the copper has the high rigidity, so the package assembly also has the higher rigidity. In order to mount the CPU, the power component or the LED 31 on the electric insulating ceramic layer 12, the thermally conductive adhesive or solder 21 is disposed therebetween. The thermally conductive adhesive is composed of an organic polymeric material and a metal or ceramic filler material mixed together. The metal or ceramic filler material is selected from the group consisting of silver particles, copper particles, aluminum particles, aluminum oxide particles, aluminum nitride particles, boron nitride particles or titanium boride particles. This is because the polymeric organic material, such as the epoxy resin in Table 1, typically has the coefficient of thermal conductivity substantially equal to 0.3 W/mK. So, the metal or ceramic particles, such as silver (Ag), copper (Cu), aluminum, silicon (Si), aluminum oxide ($Al_2O_3$), aluminum nitride (AlN), boron nitride (BN) or titanium boride ($TiB_2$) particles having the higher coefficient of thermal conductivity, are added to the polymeric organic material. In order to satisfy the requirement of the adhesive property and the cost-down requirement, the added metal or ceramic particles with the higher coefficient of thermal conductivity have a predetermined upper bound. In this case, the coefficient of thermal conductivity of the thermally conductive adhesive can be equal to or greater than 3 W/mK. The component 31 can also be bonded onto the layer 12 through soldering using the solder. The solder may be made of a tin (Sn) alloy or a silver (Ag) alloy.

Figure 5:
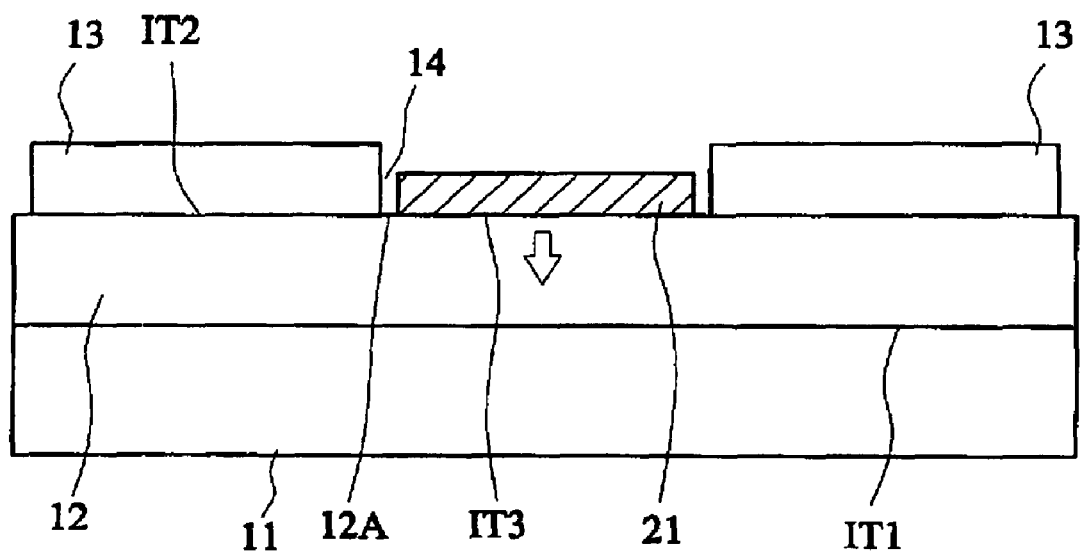
FIG. 5 is a schematic illustration showing a current flowing direction in the package assembly of the invention.

The heat dissipating structure of the invention has three layers, and the total electric resistance of the three-layer structure in the vertical direction is determined by the materials of the three layers. FIG. 5 is a schematic illustration showing a current flowing direction, indicated by the arrow, in the package assembly of the invention. As shown in FIG. 5, the total electric resistance of the heat dissipating structure is equal to a sum of electric resistances of the first to third layers 11 to 13 under the precondition of the larger plane size because a serial structure is formed. That is, $$ER_{total} = ER_1 + ER_2 + ER_3 \quad (1),$$

wherein $ER_{total}$ denotes the total electric resistance, $ER_1$ denotes the electric resistance of the first layer 11, $ER_2$ denotes the electric resistance of the second layer 12, and $ER_3$ denotes the electric resistance of the third layer 13.

As shown in Equation (1), the total electric resistance is mainly determined by the electric resistance of the material having the highest electric resistance, and the electric resistance of each layer is determined by the electric resistivity and the size of the material layer, as shown in the following equation:

$$\text{(electric resistance)} = \text{(electric resistivity} \times \text{thickness)} / \text{(area)} \quad (2),$$

According to the Equations (1) and (2), the electric resistivity of the aluminum oxide or aluminum nitride is much higher than that of the copper, so the total electric resistance of the heat dissipating structure in the vertical direction is determined by the thickness of the aluminum oxide or aluminum nitride. The minimum thickness of the electric insulating ceramic layer 12 is about 0.1 mm, but the total electric resistance of the heat dissipating structure may be equal to or greater than $10^{10} \Omega$.

Figure 6:
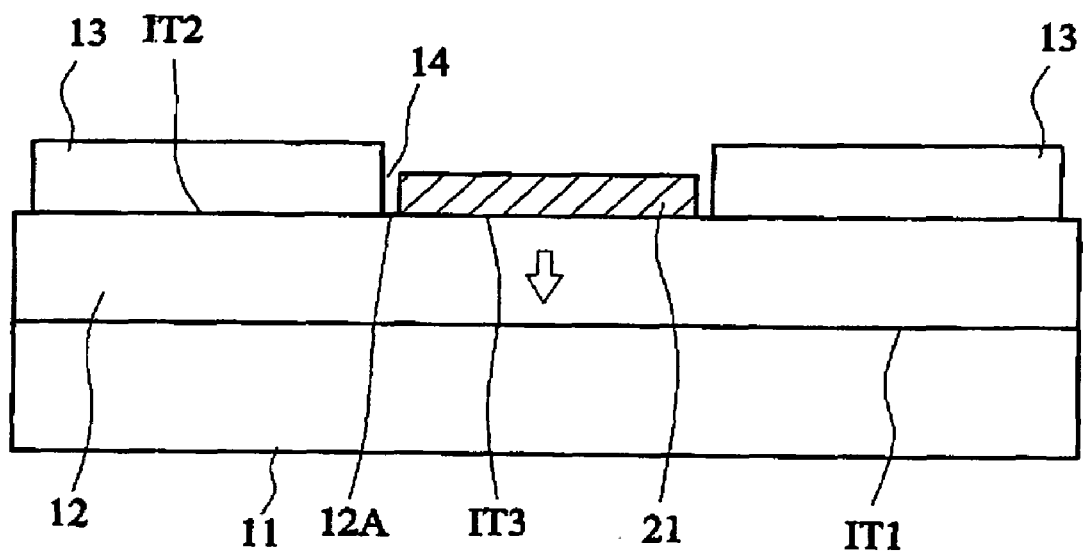
FIG. 6 is a schematic illustration showing a heat flowing direction in the package assembly of the invention.

FIG. 6 is a schematic illustration showing a heat flowing direction, indicated by the arrow, in the package assembly of the invention. As shown in FIG. 6, the total thermal resistance of the heat dissipating structure is equal to a sum of thermal resistances of the first to third layers under the precondition of the larger plane size because a serial structure is formed. That is, $$TR_{total} = TR_1 + TR_{IN1} + TR_2 + TR_{IN2} + TR_3 \quad (3),$$

wherein $TR_{total}$ denotes the total thermal resistance, $TR_1$ denotes the thermal resistance of the first layer 11, $TR_{IN1}$ denotes the thermal resistance of the first interface IT1 between the first layer 11 and the second layer 12, $TR_2$ denotes the thermal resistance of the second layer 12, $TR_{IN2}$ denotes the thermal resistance of the second interface IT2 between the second layer 12 and the third layer 13, and $TR_3$ denotes the thermal resistance of the third layer 13.

The thermal resistance of each layer is determined by the thermal resistivity and the size of the material layer, as shown in the following equation:

$$\text{(thermal resistance)} = \text{(thermal resistivity} \times \text{thickness)} / \text{area} \quad (4).$$

According to the heat dissipating structure of the invention, the area of the copper layer is large and the thermal resistivity of the aluminum oxide or aluminum nitride is slightly higher than that of the copper, so the total thermal resistance of the heat dissipating structure of the invention is not high and has the good heat dissipating ability.

Figure 7:
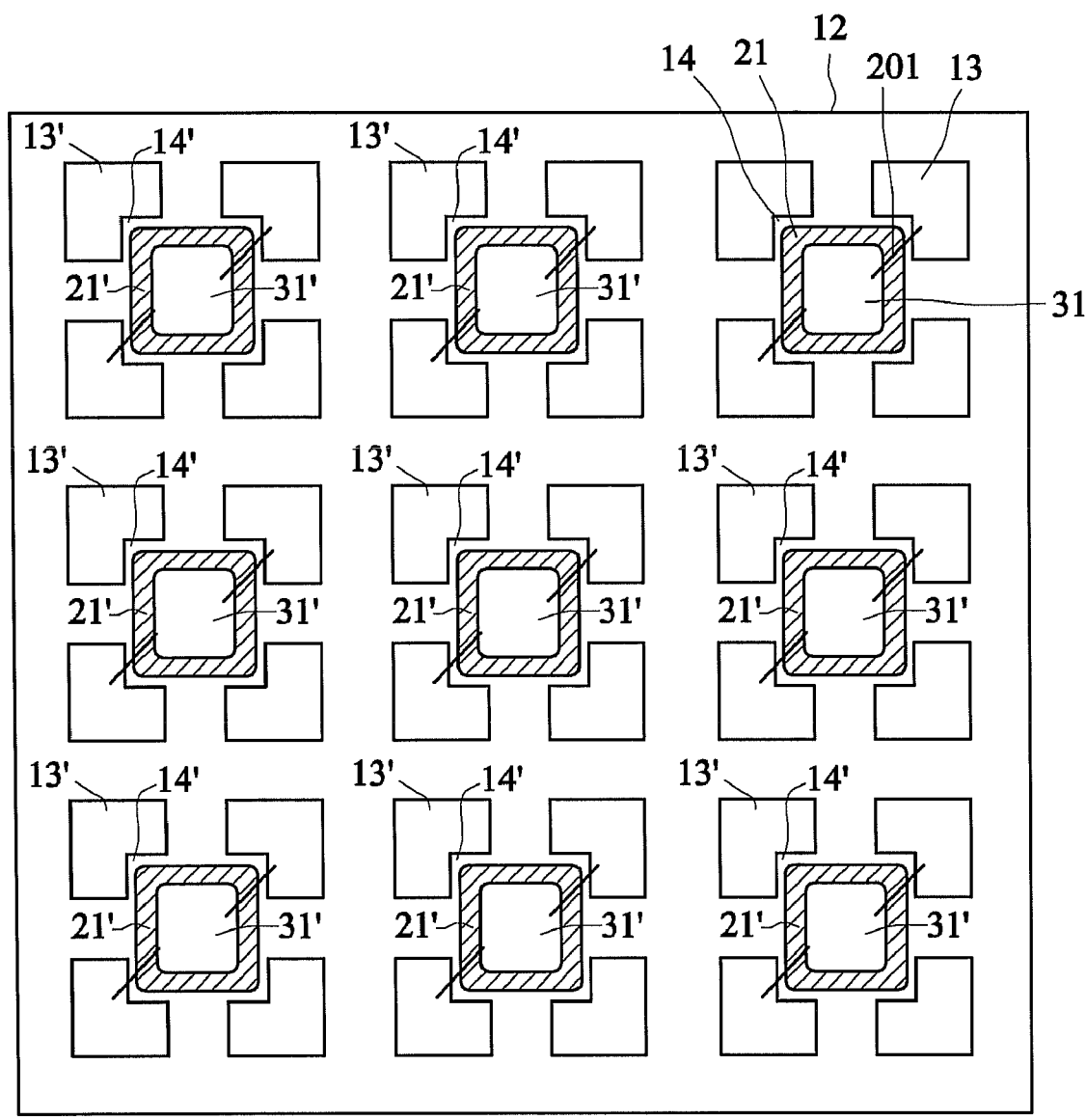
FIG. 7 is a top view showing a package assembly according to a fourth embodiment of the invention.

FIG. 7 is a top view showing a package assembly according to a fourth embodiment of the invention. As shown in FIG. 7, the package assembly is similar to that in the first embodiment except that the package assembly further includes a plurality of additional electronic components 31' respectively disposed in a plurality of additional openings 14' of the patterned upper metal layer 13' and mounted on the electric insulating ceramic layer 12 through additional thermally conductive adhesives or solder 21'. That is, the electronic components and the openings are arranged in an array so that the heat dissipating structure can support more electronic components.

In one example, an aluminum oxide sheet 12 is bonded to and interposed between two copper sheets 11 and 13 to form the three-layer structure having the good heat dissipating property. In detail, the two copper sheets 11 and 13 each having the dimension of 70×20×0.3 mm are pre-oxidized in two stages for several minutes in the air or the passivation atmosphere at the temperature ranging from 200° C. to 600° C., and then jointed to the aluminum oxide substrate 12 with the dimension of 75×26×0.5 mm in the passivation atmosphere at the temperature of 1060° C. for ten minutes. Thus, the first interface IT1 between the lower metal layer 11 and the ceramic layer 12 is the same as the second interface IT2 between the ceramic layer 12 and the upper metal layer 13 but different from a third interface IT3 between the thermally conductive adhesive 21 and the ceramic layer 12. The joined heat dissipating structure has the thickness of 1.1 mm. Then, a thermal conductivity analyzer (Omicron Multiprobe Compact, Sweden) is used to measure the coefficient of thermal conductivity, which is equal to 244 W/mK. Thus, the heat dissipating structure according to the invention has the excellent heat conducting ability and may be used as the heat dissipating substrate.

While the invention has been described by way of examples and in terms of preferred embodiments, it is to be understood that the invention is not limited thereto. To the contrary, it is intended to cover various modifications. Therefore, the scope of the appended claims should be accorded the broadest interpretation so as to encompass all such modifications.

What is claimed is:

1. A package assembly, comprising:
   a thermal conductive lower metal layer made of copper;
   an electric insulating ceramic layer disposed on and bonded to the thermal conductive lower metal layer;
   a patterned upper metal layer made of copper and disposed on and bonded to the electric insulating ceramic layer, wherein the patterned upper metal layer is a single-layered metal layer and has an opening from which the electric insulating ceramic layer is exposed; and an electronic component, which is disposed in the opening of the patterned upper metal layer, mounted on the electric insulating ceramic layer directly through a thermally conductive adhesive, and electrically connected to the patterned upper metal layer, wherein:

the thermally conductive adhesive and the patterned upper metal layer are disposed on a top surface of the electric insulating ceramic layer;

a first interface between the lower metal layer and the ceramic layer is the same as a second interface between the ceramic layer and the upper metal layer but different from a third interface between the thermally conductive adhesive and the ceramic layer; and a sidewall of the opening has an inclined surface or a curved surface for reflecting light rays emitted from the electronic component, and the inclined surface or the curved surface is made of the copper of the upper metal layer bonded to the ceramic layer.

2. The package assembly according to claim 1, wherein the thermal conductive lower metal layer has a thickness ranging from 0.1 to 5 mm.

3. The package assembly according to claim 1, wherein the electric insulating ceramic layer is made of aluminum oxide or aluminum nitride.

4. The package assembly according to claim 3, wherein the electric insulating ceramic layer has a thickness ranging from 0.1 to 5 mm.

5. The package assembly according to claim 1, wherein the patterned upper metal layer is entirely made of the copper.

6. The package assembly according to claim 5, wherein the patterned upper metal layer has at least one electric connection point.

7. The package assembly according to claim 1, wherein the patterned upper metal layer has a thickness ranging from 0.05 to 5 mm.

8. The package assembly according to claim 1, further comprising a plurality of additional electronic components respectively disposed in a plurality of additional openings of the patterned upper metal layer and mounted on the electric insulating ceramic layer through additional thermally conductive adhesives.

9. The package assembly according to claim 1, wherein the electronic component is a central processing unit (CPU), a light-emitting diode (LED) or a power component.

10. The package assembly according to claim 1, wherein the thermally conductive adhesive is composed of an organic polymeric material and a metal or ceramic filler material mixed together.

11. The package assembly according to claim 10, wherein the metal or ceramic filler material is selected from the group consisting of silver particles, copper particles, aluminum particles, silicon particles, aluminum oxide particles, aluminum nitride particles, boron nitride particles or titanium boride particles.

12. The package assembly according to claim 1, further comprising a plurality of wires electrically connected to the electronic component and the patterned upper metal layer.

13. The package assembly according to claim 12, further comprising a package material applied to the patterned upper metal layer, the electronic component the thermally conductive adhesive and the wires to encapsulate the patterned upper metal layer, the electronic component, the thermally conductive adhesive and the wires.

* * * * *